(12) United States Patent
Sleeman et al.

(10) Patent No.: US 11,755,166 B2
(45) Date of Patent: Sep. 12, 2023

(54) DISPLACEMENT SENSING

(71) Applicant: TouchNetix Limited, Fareham (GB)

(72) Inventors: Peter Timothy Sleeman, Waterlooville (GB); Robert Money, Fareham (GB)

(73) Assignee: TouchNetix Limited, Fareham (GB)

( * ) Notice: Subject to any disclaimer, the term of this patent is extended or adjusted under 35 U.S.C. 154(b) by 50 days.

(21) Appl. No.: 16/640,124

(22) PCT Filed: Aug. 29, 2018

(86) PCT No.: PCT/GB2018/052434
§ 371 (c)(1),
(2) Date: Feb. 19, 2020

(87) PCT Pub. No.: WO2019/048827
PCT Pub. Date: Mar. 14, 2019

(65) Prior Publication Data
US 2021/0191574 A1     Jun. 24, 2021

(30) Foreign Application Priority Data

Sep. 6, 2017   (GB) .................................... 1714301

(51) Int. Cl.
| | | |
|---|---|---|
| *G06F 3/044* | (2006.01) | |
| *G01L 1/14* | (2006.01) | |
| *H03K 17/975* | (2006.01) | |

(52) U.S. Cl.
CPC ............ *G06F 3/0447* (2019.05); *G01L 1/142* (2013.01); *G06F 3/0445* (2019.05);
(Continued)

(58) Field of Classification Search
CPC .... G06F 3/0447; G06F 3/0443; G06F 3/0444; G06F 3/04883; G06F 3/0412;
(Continued)

(56) References Cited

U.S. PATENT DOCUMENTS

| | | | | |
|---|---|---|---|---|
| 5,488,204 A | * | 1/1996 | Mead | .................. G06F 3/04883 |
| | | | | 178/18.06 |
| 10,963,090 B2 | * | 3/2021 | Sleeman | ............... G06F 3/0443 |

(Continued)

FOREIGN PATENT DOCUMENTS

| | | |
|---|---|---|
| GB | 2517087 A | 2/2015 |
| GB | 2533949 A | 7/2016 |

(Continued)

OTHER PUBLICATIONS

International Search Report and Written Opinion for corresponding Patent Application No. dated Nov. 19, 2018.

(Continued)

*Primary Examiner* — Fred Tzeng
(74) *Attorney, Agent, or Firm* — Renner, Otto, Boisselle & Sklar

(57) ABSTRACT

A sensing apparatus comprising: a displacement sensor comprising capacitance measurement circuitry configured to provide a displacement sensor output signal indicative of a separation between a frame element and a displacement element movably mounted with respect to the frame element; a touch sensor comprising measurement circuitry configured to provide a touch sensor output signal indicative of when an object is determined to be touching the displacement element; and a processing element configured to output a displacement detection signal to indicate there is determined to be a displacement of the displacement element relative to the frame element in response to determining the touch sensor output signal indicates an object is touching the displacement element and a difference between the displacement sensor output signal and a baseline displacement sensor output signal exceeds a threshold value, wherein the baseline displacement sensor output signal is determined from the displacement sensor output signal in a time period determined from when the touch sensor output signal ini- (Continued)

tially indicates the object is touching the displacement element.

13 Claims, 4 Drawing Sheets

(52) U.S. Cl.
CPC . *H03K 17/975* (2013.01); *G06F 2203/04105* (2013.01); *H03K 2217/9651* (2013.01)

(58) Field of Classification Search
CPC ..... G06F 3/0317; G06F 3/016; H03K 17/975; G01L 1/142
See application file for complete search history.

(56) References Cited

U.S. PATENT DOCUMENTS

| | | | |
|---|---|---|---|
| 2010/0024573 A1 | 2/2010 | Daverman et al. | |
| 2012/0188200 A1* | 7/2012 | Roziere | G06F 3/0412 345/174 |
| 2015/0009178 A1* | 1/2015 | Schneider | G06F 3/016 345/174 |
| 2015/0177857 A1* | 6/2015 | Chin | G06F 3/0317 345/163 |
| 2016/0224168 A1 | 8/2016 | Watanabe et al. | |
| 2016/0226521 A1 | 8/2016 | Liu | |
| 2017/0219330 A1 | 8/2017 | Sleeman et al. | |
| 2017/0269754 A1* | 9/2017 | Liu | G06F 3/0444 |
| 2018/0157353 A1* | 6/2018 | Sleeman | H03K 17/975 |
| 2019/0258341 A1* | 8/2019 | Sleeman | G06F 3/0443 |
| 2020/0139814 A1* | 5/2020 | Galan Garcia | B32B 27/08 |

FOREIGN PATENT DOCUMENTS

| | | | | |
|---|---|---|---|---|
| GB | 2558912 A | * | 7/2018 | ........... G06F 3/0414 |
| WO | 2018/065760 A1 | | 4/2018 | |

OTHER PUBLICATIONS

GB Search Report for corresponding Patent Application No. GB 1714301.7 dated Mar. 9, 2018.

* cited by examiner

DISPLACEMENT SENSING

BACKGROUND OF THE INVENTION

The present invention relates to displacement sensing, and in particular displacement sensing in conjunction with touch sensing, e.g. using capacitive sensing techniques.

Capacitive sensing techniques have become widespread for providing touch-sensitive inputs, for example in computer tablets, mobile phones, and in many other applications. Touch sensitive input devices are generally perceived to be more aesthetically pleasing than input devices that are based on mechanical switches. Nonetheless, the present inventors have recognised there are still situations in which a user-interface that is responsive to mechanical input may be desired. In particular, the inventors have recognised there are situations in which there is a desire to measure the physical displacement of a displacement element, for example to provide the equivalent of a "click" when navigating a cursor across a display screen using a touch sensor. Furthermore, the inventors have recognised it can be desirable to provide such functionality using capacitive sensing techniques rather than mechanical switching techniques. Not only can capacitive sensing techniques provide for more reliable sensors (as they are less prone to mechanical wear), there may be situations in which displacement sensing is desired in conjunction with other sensors based on capacitive sensing (for example to measure the displacement of a capacitive touch screen), and so it can be convenient to adopt the same sensing technologies for both touch position and displacement sensing aspects.

One issue with using capacitive techniques for sensing the displacement of a displaceable element is the potential for the presence of whatever is causing the displacement, or other surrounding objects, to impact the capacitance measurements that are made to determine when a displacement has occurred. For example, one simple way to measure a change in separation between two elements (i.e. a displacement) is to measure a change in capacitive coupling between them. However, because the capacitive coupling between the two elements is affected by surrounding objects, it can be difficult determine whether an observed change in capacitance is due to an actual displacement, or due to a change in the arrangement of surrounding objects, for example because user's hand is resting on the surface of the sensor, or the device incorporating the sensor has been placed on a surface.

There is therefore a desire for apparatus and methods that can help to address these kinds of issues.

SUMMARY OF THE INVENTION

The present disclosure can help address or mitigate at least some of the issues discussed above.

Respective aspects and features of the present disclosure are defined in the appended claims.

It is to be understood that both the foregoing general description and the following detailed description are exemplary, but are not restrictive, of the present technology. The described embodiments, together with further advantages, will be best understood by reference to the following detailed description taken in conjunction with the accompanying drawings.

BRIEF DESCRIPTION OF THE DRAWINGS

The invention is now described by way of example only with reference to the following drawings in which.

DETAILED DESCRIPTION

Aspects and features of certain examples and embodiments of the present invention are discussed/described herein. Some aspects and features of certain examples and embodiments may be implemented conventionally and these are not discussed/described in detail in the interests of brevity. It will thus be appreciated that aspects and features of apparatus and methods discussed herein which are not described in detail may be implemented in accordance with any conventional techniques for implementing such aspects and features.

Figure 1:
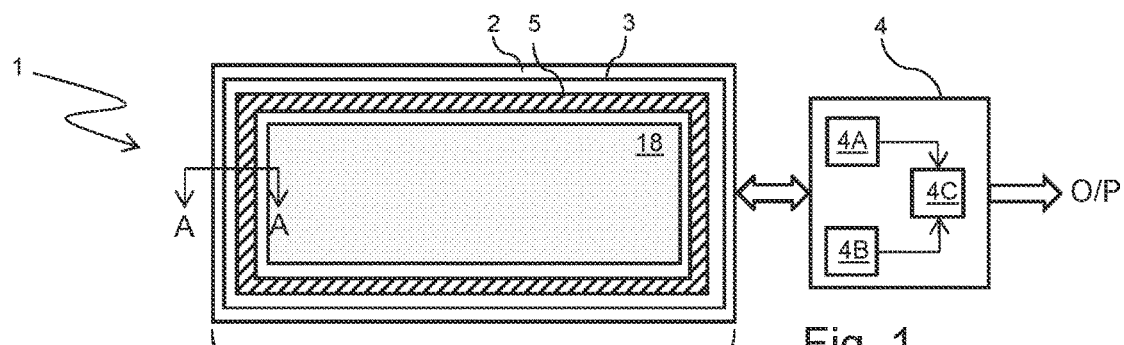
FIG. 1 schematically represents a sensor element and controller element of a sensing apparatus according to certain embodiments of the invention.
Figure 2:
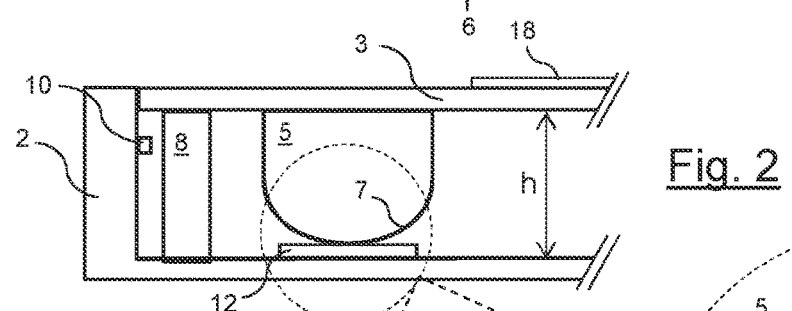
FIG. 2 schematically shows in cross-section a portion of the sensing apparatus of FIG. 1 in a non-displaced state.
Figure 3:
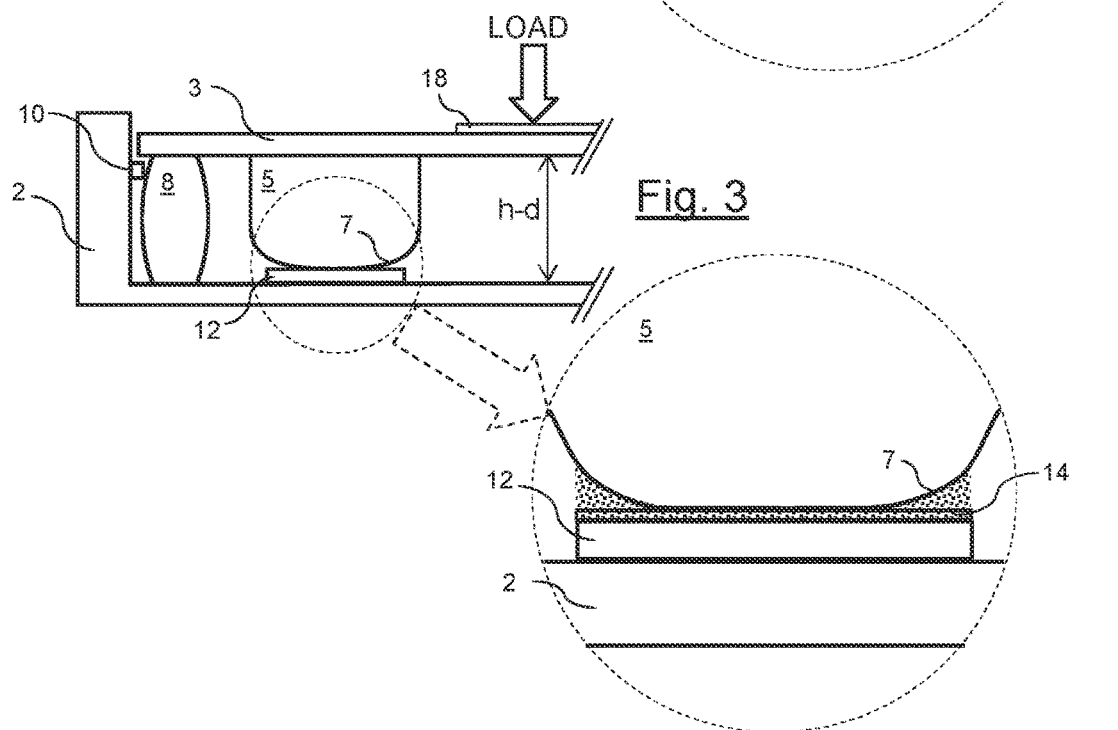
FIG. 3 schematically shows in cross-section a portion of the sensing apparatus of FIG. 1 in a displaced state.

FIGS. 1, 2 and 3 schematically represent various aspects of a sensing apparatus 1 in accordance with certain embodiments of the invention. The sensing apparatus 1 comprises a touch-sensitive displacement element 3 that is movably mounted with respect to a frame element. The touch-sensitive displacement element 3 comprises a substrate, e.g. formed from glass or plastic, and a touch sensitive element 18 mounted thereon. The sensing apparatus 1 is operable to measure both a displacement of the displacement element 3 and the presence of an object over/touching the displacement element 3 using capacitive sensing techniques. Overall the sensing apparatus 1 comprises two main functional parts, namely a sensor element 6 comprising the displacement element 3 and associated components used for capacitively measuring displacements and touches applied to the displacement element 3, and a controller element 4 comprising capacitance measurement circuitry 4A, 4B for measuring capacitances indicative of displacements and touches applied to the sensing element, and processor circuitry 4C for processing the capacitance measurements.

The sensor element 6 comprises displacement sensing electrodes 5, 12 for use in detecting displacements of the moveably mounted displacement element 3 with respect to the frame element 2 based on capacitive coupling measurements associated with the displacement sensing electrodes. These capacitive coupling measurements are made using displacement element capacitance measurement circuitry 4A within the controller element 4. The configuration of displacement sensing electrodes and the touch element capacitance measurement circuitry 4B for measuring capacitive couplings associated with the displacement sensing electrodes may be based on any conventional techniques for capacitance based displacement sensing. In this example it is assumed the displacement element capacitance measurement circuitry 4A is configured to provide an output signal to the processing circuitry 4C which comprises an indication of a measured strength of a capacitive coupling between the displacement sensing electrodes in accordance with known techniques.

The touch sensitive element 18 for the sensor element 6 comprises an arrangement of touch sensing electrodes (not shown in the figures) for use in detecting when there is an object touching the displacement element 3 based on capacitive coupling measurements associated with the touch sensing electrodes. These capacitive coupling measurements are made using touch element capacitance measurement circuitry 4B within the controller element 4. In this example the touch sensitive element 18 and associated touch element capacitance measurement circuitry 4B provide a position-sensitive touch sensor, i.e. a touch sensor configured to detect both the presence and also the position of an object (or positions for multiple objects for a multi-touch sensor) over the displacement element. In other examples the touch sensor functionality of the sensing apparatus may simply provide an indication of whether or not there is an object in a touch-sensitive region of the touch sensitive element without any position information. The arrangement of touch sensing electrodes on the displacement element 3 and the touch element capacitance measurement circuitry 4B for measuring capacitive couplings associated with the touch sensitive element may be in accordance with any conventional approaches for touch sensing. In this example it is assumed the touch element capacitance measurement circuitry 4B is configured to provide an output signal to the processing circuitry 4C which comprises an indication of a measured strength and location of a capacitive coupling associated with the presence of an object adjacent to the touch sensitive element in accordance with known techniques.

Thus the sensing apparatus of FIG. 1 includes a displacement sensing function for detecting a displacement of the touch-sensitive displacement element 3 and a touch sensing function for detecting the presence (and in this example also the position) of an object touching the touch-sensitive displacement element 3.

The displacement sensing function is provided by the displacement sensing electrodes 5, 12 and associated displacement element capacitance measurement circuitry 4A in the controller element 4. Together the displacement element 3, displacement sensing electrodes 5, 12, and the displacement element capacitance measurement circuitry 4A may thus be considered a displacement sensor with an output that provides an indication of the degree of capacitive coupling between the displacement sensing electrodes.

The touch sensing function is provided by the touch sensing electrodes of the touch sensitive element 18 and associated touch element capacitance measurement circuitry 4B in the controller element 4. Together the touch sensitive element 18 with its touch sensing electrodes and the touch element capacitance measurement circuitry 4B may thus be considered a touch sensor with an output that provides an indication of the degree of capacitive coupling and position associated with an object, e.g. a user's finger, touching the displacement element (in particular touching the touch sensitive element 18 of the displacement element).

As noted above, the specific configurations for the displacement sensor component and the touch sensor component in terms of their structure and their capacitance measurement circuitry may be based on conventional approaches. However, in accordance with certain embodiments of the disclosure, new approaches are provided for processing the outputs from the displacement element capacitance measurement circuitry 4A and the touch element capacitance measurement circuitry 4B to determine when a displacement is deemed to have occurred. In that sense the specific implementations for the displacement sensor and touch sensor are not of primary significance to the principles described herein, rather what is more significant in accordance with certain embodiments of the disclosure is how the outputs from the displacement sensor and touch sensor (i.e. the outputs from their respective capacitance measurement circuitry 4A, 4B) are processed, for example in the processing circuitry 4C.

Having set out some of the operating principles for sensing apparatus in accordance with certain embodiments, the specific example displacement sensor and the touch sensor implementation represented in FIGS. 1 to 3 will now be described in more detail with reference to FIGS. 1 to 3. FIG. 1 schematically represents the sensor element 6 in plan view and the controller element 4 in highly schematic form (i.e. as a functional block). FIGS. 2 and 3 respectively show portions of the sensor element 6 of the sensing apparatus 1 in cross-section (taken on the line A-A represented in FIG. 1), with FIG. 2 showing the sensing apparatus 1 in a non-displaced (rest) state and FIG. 3 shows the sensing apparatus 1 in a displaced state.

The sensing apparatus 1 is arranged to measure a displacement of the displacement element 3 relative to the frame element 2, for example in response to a user pressing on or otherwise applying a displacement load to the displacement element 3. The displacement sensor function is based on measuring changes in capacitive coupling associated with a deformable electrode 5 arranged between the displacement element 3 and frame element 2 and a reference electrode 12 (the deformable electrode and reference electrode are the displacement sensing electrodes discussed above). This capacitive coupling is measured by the displacement element capacitance measurement circuitry 4A, for example using conventional capacitive measurement techniques. Displacement of the displacement element 3 relative to the frame element 2 causes a change in the capacitive coupling between the deformable electrode 5 and the reference electrode 12 as the deformable electrode 5 deforms under the displacement load. It will be appreciated the use of capacitive sensing technologies to detect displacement may be convenient in certain implementations in that similar controller technologies can be used for sensing displacement and for sensing the presence and positions of objects adjacent the displacement element 3. Also, a capacitive-based displacement sensing approach can be configured to provide an indication of a degree of displacement, as opposed to a simple binary detection. This can be useful in some cases, for example, to allow changes in a desired threshold for establishing when a displacement is deemed to have occurred. For example, the sensitivity to detect displacement may be adjusted by simply changing the threshold at which a displacement is considered to have occurred. Thus, if it is desired that a relatively light touch should be recognised as a displacement, a relatively low threshold can be set, whereas if it is desired that a relatively heavy touch is needed to be considered a displacement, a relatively high threshold could be set. However, as already noted it will be appreciated the specific displacement sensing technology is not significant in the principles described herein and in other implementations other types of displacement sensing technology may be used.

The displacement element 3 is the part of sensor apparatus 1 to which a load may be applied during normal use. The application of an example load during use, e.g. corresponding to a user pressing a finger on the displacement element 3, is schematically shown in FIG. 3 by the arrow labelled "LOAD". For ease of explanation, the side of the displacement element 3 to which the load is applied in normal use may sometimes be referred to herein as the "upper" or "outer" side of the displacement element 3 (or similar terminology such as "top"), with the other side being referred to as "lower" or "inner" (or similar terminology, such as "bottom"). Thus, the surface of the displacement element 3 shown uppermost in the orientation of FIGS. 2 and 3 may sometimes be referred to as the upper/outer/top surface of the displacement element 3. Likewise, the lowermost surface of the displacement element 3 for the orientation of FIGS. 2 and 3 may sometimes be referred to as the bottom/lower/inner surface. Corresponding terms may similarly be used in respect of other parts of the sensing apparatus 1 in accordance with the orientation shown in the relevant figures. However, it will be appreciated this terminology is used purely for convenience of explanation and is not intended to suggest a particular orientation of the sensing apparatus 1 should be adopted in normal use. For example, although in the orientation of FIGS. 2 and 3 the upper surface of the sensor element 6 is shown uppermost, the sensor element 6 could equally be used in a downward facing configuration, or facing outwards from a vertical surface, according to the implementation at hand. More generally, the sensing apparatus 1 may be incorporated in a portable device (such as a tablet computer or mobile telephone), and in that case the orientation in use will vary according to how a user happens to be holding the device.

The frame element 2 provides a structural support for the displacement element 3 and will typically be connected to, or comprise an integral part of, an apparatus in which the sensing apparatus 1 is provided. The frame element 2 may comprise any suitable structural material, for example it may be formed from metal or plastic. The frame element 2 in this example defines a recess/opening into which the displacement element 3 is received and moveably supported therein by a support element 8 arranged around a peripheral part of the displacement element 3. In this example the movable mounting of the displacement element 3 relative to the frame element 2 is provided by virtue of the support element 8 comprising a resiliently compressible material. An upper edge of the support element 8 is bonded to the underside of the displacement element 3 and a lower edge of the support element 8 is bonded to the frame element 2. Conventional bonding techniques can be used for bonding the support element 8 to the other parts of the sensing apparatus 1, for example having regard to bonding techniques appropriate for the materials involved.

The support element 8 in this example is thus generally in the form of a rectangular ring arranged around a peripheral part of the displacement element 3. The support element 8 has a generally rectangular cross-section when in its relaxed state (as shown in FIG. 2), although when the support element 8 is compressed by virtue of a load being applied to the displacement element 3, its sides may bow out to accommodate the movement, as schematically indicated in FIG. 3. It will, however, be appreciated that other shapes could be used in accordance with established mounting practices. For example, more complex shapes for the support element 8 may be chosen to provide different degrees of compressibility according to the degree to which the support element is already compressed. The frame element 2 may include a stop to limit the extent to which the support element 8 may be compressed (i.e. to limit the extent to which the displacement element may be displaced relative to the frame element 2). In this example such a stop is provided by a suitably arranged protrusion 10 from a side wall of the recess defined by the frame element 2. This protrusion 10 may extend all around the recess or may be provided at a number of discrete locations around the recess.

The support element 8 in this example comprises an elastomeric material having an appropriate degree of rigidity and compressibility according to the application at hand (i.e. providing a desired level of resistance to compression). In some cases there may be a desire for a material having relatively low compressibility, thereby requiring a relatively high load to generate a given displacement of the displacement element 3 relative to the frame element 2. Conversely, in some cases there may be a desire for a material having relatively high compressibility, thereby requiring a relatively low load to generate a given displacement of the displacement element 3 relative to the frame element 2. This will be a question of design choice. For example, in the context of displacement sensor forming a user interface a designer may choose how hard the user must press to cause a given displacement. This may be done, for example, to balance the risk of accidental activation against requiring too great a force for activation. A material having the desired degree of compressibility may be selected from modelling or empirical testing, for example.

With reference to FIGS. 2 and 3, the deformable electrode 5 is arranged between the displacement element 3 and the frame element 2 and follows a generally rectangular path around (i.e. within and adjacent to) a peripheral region of the displacement element 3. The deformable electrode 5 has a generally "D" shaped cross-section with a lower curved wall 7, which may also be referred to as a contact surface 7 for the deformable electrode 5. The specific geometry of the deformable electrode 5, e.g. in terms of its cross-sectional size, separation from the peripheral edge of the displacement element 3, and the extent to which it extends around the whole periphery, is not significant to the principles described herein and may vary depending on the specific construction of the sensing apparatus 1.

The deformable electrode 5 may be formed in a number of different ways. In this example the deformable electrode 5 comprises a suitably profiled elastomeric conductive foam; however, other materials may also be used. An electrical connection to the deformable electrode 5 to allow for the measurements discussed further below may be made using one or more conductors in contact with the deformable electrode 5.

Between the deformable electrode 5 and the frame element 2 is the reference electrode 12. The reference electrode 12 is generally in alignment with the deformable electrode 5 and follows a corresponding path beneath the deformable electrode 5. An upper surface of the reference electrode 12 is provided with an electrical insulator layer 14 (shown schematically in the magnified parts of FIGS. 2 and 3). The insulator layer 14 prevents the overlying deformable electrode 5 from coming into direct electrical contact with the reference electrode 12 when the deformable electrode 12 is pressed against the reference electrode 12 during displacement of the displacement element 3 towards the frame element 2.

The reference electrode 12 may be provided in a number of different ways, for example as a conductive trace deposited on the frame element 2. The insulator layer 14 may also be provided in a conventional manner, for example comprising a plastic film or layer of plastic/resin encapsulant over the reference electrode 12. It will, however, be appreciated that different techniques can be used in different implementations. Although the reference electrode 12 is schematically represented in FIGS. 2 and 3 as being disposed on top of the frame element 2, in other examples the reference electrode may be embedded within the frame element 2. If the frame element 2 is conductive, the reference electrode 12 may be insulated therefrom. It will be appreciated the reference electrode 12 and insulator layer 14 might typically be relatively thin compared to the other elements of the sensor element 6 shown in FIGS. 2 and 3, but these figures are not drawn to scale with the reference electrode 12 (and its layer of insulation 14) shown with exaggerated thickness in the cross-sections of FIGS. 2 and 3 for ease of representation.

As noted above, FIG. 2 schematically represents the sensor element 6 in a rest state with no displacement load applied to the displacement element 3. In this example the gap between the upper surface of the frame element 2 and a lower surface of the displacement element 3 is, as indicated in FIG. 2, h. This gap h corresponds with the height of the support element 8 in its relaxed state. In this example the support element 8 is sized to provide a gap h that is slightly less than the height of the deformable electrode 5, such that the deformable electrode 5 is in slight compression so there is a portion of its contact surface 7 for which there is no free space (air gap) between the deformable electrode 5 and the frame element 2, even when in the rest (non-displaced) state.

FIG. 3 schematically represents the sensor element 6 in a displaced state in which a displacement load is applied to the displacement element 3. The displacement load may, for example, be provided by a user's finger pressing on the outer surface of the displacement element 3. The support element 8 and the deformable electrode 5 are both compressed under the action of the displacement load allowing the displacement element 3 to move along a displacement direction towards the frame element 2 by an amount d. The magnitude of the displacement d will be a function of the force (load) applied and the combined resilience of the support element 8 and the deformable electrode 5. The displacement element 3 in FIG. 3 is schematically shown as remaining parallel to the frame element when displaced, but in general it may be expected the displacement element 3 may be tilted depending on the location of the load (i.e. the value of d may be different at different positions across the displacement element 3). In this example the magnitude of the displacement is assumed to be around 0.1 cm.

As a consequence of the deformable electrode 5 being squashed under the displacement load, the curved contact surface 7 is pressed harder against the underlying insulator layer 14. This causes the contact surface 7 to flatten against the insulator layer 14, thereby reducing the overall volume between the deformable electrode 5 and the reference electrode 12 as compared to the rest state represented in FIG. 2. The space between the deformable electrode 5 and the reference electrode 12 is schematically shown with shading in FIGS. 2 and 3, and it can be seen how the shading in FIG. 3 occupies a smaller area than the shading in FIG. 2.

Because the volume of the space between the deformable electrode 5 and the reference electrode 12 is reduced under the displacement load, the capacitive coupling between the deformable electrode 5 and the reference electrode 12 increases when the displacement load is applied. The controller element 4, and in particular the displacement element capacitance measurement circuitry 4A, is configured to measure a characteristic of the capacitive coupling associated the two electrodes, thereby allowing a determination as to whether a displacement has occurred to be made as discussed further herein. Connections between the displacement capacitance measurement circuitry 4A and the respective electrodes can be established in accordance with conventional techniques, for example using appropriate wiring. There are various different ways in which a characteristic of the capacitive coupling between the two electrodes can be measured. For example, the mutual capacitive coupling between the two electrodes could be measured by applying a drive signal to one of the electrodes and measuring the extent to which the drive signal is coupled to the other of the electrodes. Alternatively, the self-capacitance of one of the electrodes could be measured with respect to a reference potential whilst the other electrode is connected to the reference potential (e.g. a system ground or other system reference potential). For simplicity the system reference potential may sometimes be referred to herein as a system ground or earth, but it will be appreciated the actual potential itself may be arbitrary and is not significant (e.g. it could be 0V, 5V or 12V, or any other value according to the implementation at hand). In yet another example, one of the electrodes may comprise two components which are capacitively coupled to one another. For example the reference electrode 12 of FIGS. 1 to 3 may be replaced with a reference electrode comprising a pair of parallel or interdigitated conductors which are insulated from one another but in a relatively close proximity on the frame element 2, with the gap between them underlying the deformable electrode 5. The mutual capacitive coupling between the two conductors comprising the reference electrode could be measured by applying a drive signal to one of the conductors and measuring the extent to which the drive signal is coupled to the other of the conductors. The component of the drive signal coupled between the electrodes will generally be reduced as the overlying deformable electrode is compressed on to them under the displacement load. Nonetheless, it will be appreciated the specific capacitive sensing technology used to detect changes in the capacitive coupling between the deformable electrode 5 and the reference electrode 12 is not significant to the principles described herein.

Turning now to the touch sensing function, the sensing apparatus 1 is configured to detect the presence of objects touching the touch sensitive element 18 of the displacement element 3 based on their effect on measurements of capacitive couplings associated with the touch sensing electrodes comprising the touch sensitive element. The touch sensitive element 18 of the displacement element 3 may be based on any known design, and may be constructed from a single layer or multiple, stacked layers, e.g., a one or more electrode layers comprising the touch sensor electrodes (depending on design) and a protective cover layer.

The touch sensor electrodes comprising the touch sensitive element 18 include a number of conductive traces or patches defining the touch sensitive area of the touch sensitive element 18. In this example it is assumed the touch sensitive area of the touch sensitive element extends across a centre region of the displacement element 3 to just inside the position of the deformable electrode 5. However, in other examples the sensitive area of the touch sensitive element may extend further across the surface of the displacement element 3, for example extending over the deformable electrode 5 and the support element 8. The touch sensor electrodes are electrically connected to the touch element capacitance measurement circuitry 4B in the controller element 4, which is configured to measure changes in capacitance couplings associated with the touch sensor electrodes caused by objects adjacent (e.g. touching) the touch sensitive element 18 of the displacement element 3. As will be appreciated there are many well-established techniques for capacitively sensing the positions of objects over a two-dimensional sensing surface, and any of these technologies may be adopted for the touch sensing function of the sensor element 6. In this regard, the specific pattern of electrodes/traces provided across the sensing surface and the associated capacitance measurement techniques provided by the touch element capacitance measurement circuitry 4B will depend on the specific sensing technology adopted. As is conventional, the touch sensor electrodes/traces may be made from any suitable conductive material, such as copper or transparent indium tin oxide (ITO). In some examples, the touch sensor electrodes may be arranged in a grid with overlapping horizontal (X) and vertical (Y) electrodes in a well-established configuration for capacitive sensing.

In essence, signalling associated with the touch sensor electrodes comprising the touch sensitive element 18 provides an indication of a degree of capacitive coupling between one or more objects overlying the touch sensitive element and the touch sensor electrodes. The specific nature of the signalling and the manner in which it indicates a degree of capacitive coupling will depend on the sensing technology adopted. The textbook "Capacitive Sensors: Design and Applications" by Larry K. Baxter, August 1996, Wiley-IEEE Press, ISBN: 978-0-7803-5351-0 [1] summarises some of the principles of conventional capacitive sensing techniques that may be used for measuring capacitance characteristics in accordance with various implementations. More generally, and as already noted, any established techniques for measuring indications of degrees of capacitive couplings between objects and a sensing surface could be adopted.

One example technique for measuring a degree of capacitive coupling uses so-called mutual capacitance measurement techniques. Mutual capacitance can be measured by applying a time varying drive signal to one electrode (e.g., a horizontal electrode) and measuring the extent to which the drive signal is capacitively coupled to another electrode (e.g., a vertical electrode) using conventional capacitance measurement techniques. The magnitude of the mutual capacitive coupling between the electrodes is influenced by the presence of nearby objects, e.g., human fingers. Changes in mutual capacitance measurements may therefore be considered to represent changes in capacitive couplings between nearby objects and the sensing surface.

Another example technique for measuring a degree of capacitive coupling uses so-called self-capacitance measurement techniques. Self-capacitance can be measured by determining the capacitance of an array of electrodes with respect to a reference potential. For example, the self-capacitance of a rectangular array of electrodes can be individually monitored. Changes in the measured self-capacitance for a particular electrode can be considered to represent a change in capacitive coupling between an object adjacent that particular electrode.

It should be understood that the above discussion sets out only some example ways in which capacitive sensing may be implemented for the sensing apparatus and it will be appreciated various other established techniques, or combination of established techniques, may be used for different implementations.

The displacement element 3 in this example is in the form of a planar rectangle, but other shapes may be used. The size of the displacement element 3 may be chosen according to the implementation at hand to provide the desired area over which a displacement load/force is to be detected. Purely for the sake of a specific example, it will be assumed here the displacement element 3 has a size of around 10 cm (width)×5 cm (height)×0.3 cm (thickness). The displacement element 3 in this example is formed generally of a non-conductive material, for example a glass or plastic material, but includes the conductive electrodes/traces comprising the touch sensitive element. The displacement element 3 may be transparent or opaque according to the application at hand. For example, in some implementations a display screen may be provided below the sensor element 6. In this case the displacement element 3 (and any parts of the frame element 2 overlying the display screen) should be transparent, at least to some extent, to allow a user to see the display screen through the sensor element 6. In other cases there may be a desire from a design perspective to hide what is behind the displacement element 3 (for example because there is internal wiring or structural elements of an apparatus in which the sensor element 6 is mounted which are not intended to be visible to the user for aesthetic reasons). In this case the displacement element 3 and/or frame element 2 may be opaque. In such cases, the displacement element 3 may include markings or other form of indicia representing certain functions associated with the device in which the sensing apparatus 1 is to be used, e.g., the letters of the alphabet at positions on the displacement element 3 corresponding to a conventional keyboard layout.

As discussed above and schematically represented in FIG. 1, the controller element 4 comprises functional circuitry blocks comprising the displacement element capacitance measurement circuitry 4A, the touch element capacitance measurement circuitry 4B, and the processing circuitry 4C. The controller element 4 thus comprises circuitry which is suitably configured/programmed to provide the functionality of these circuitry blocks as discussed herein using conventional programming/configuration techniques for capacitive sensing applications. While the displacement element capacitance measurement circuitry 4A, touch element capacitance measurement circuitry 4B, and processing circuitry 4C are schematically shown in FIG. 1 as separate elements for ease of representation, it will be appreciated that the functionality of these components can be provided in various different ways, for example using a single suitably programmed general purpose computer, or field programmable gate array, or suitably configured application-specific integrated circuit(s)/circuitry or using a plurality of discrete circuitry/processing elements for providing different elements of the desired functionality.

While in principle a capacitive displacement sensor can provide an indication of an amount of displacement, in many applications capacitive displacement sensors are used to provide a more straightforward binary indication as to whether or not a displacement element is to be considered as being displaced or not displaced. For example, this is typically the case in an implementation in which the displacement sensor is used to provide the same functionality of a simple mechanical button or switch, for example to provide a "click" function for a computer mouse trackpad or mobile phone display. Thus, in one application a mobile phone or other apparatus may have a user interface that includes a sensing apparatus of the kind discussed above overlaying a display screen. A user may press over the display screen at a desired location to indicate a selection of an underlying icon displayed on the display screen. The user's press may thus be detected using the displacement sensor function of the sensing apparatus and the location of the displacement press may be detected by the touch sensor function and together these may be interpreted by a controller for the apparatus in which the sensing apparatus is incorporated as a user selection of an operating function associated with the relevant icon. It will also be appreciated in some cases a displacement sensor may be configured to provide both a binary indication as to whether a displacement should be considered to have occurred and an indication of the size of the displacement. For example, the displacement sensor may be configured to both determine that at least a minimum amount displacement has occurred (i.e. a binary indication that there has been a displacement) and an indication of the magnitude of that displacement. This may be appropriate in an implementation in which the magnitude of the displacement is of interest, but there is a desire to avoid reporting the magnitude of the displacement for small displacements, for example which might be due to noise in the measurement circuitry or a user lightly resting their finger on a display element without actually wishing to indicate a press.

Thus, an important consideration in some displacement sensing applications is how to determine when the output from a displacement sensor should be considered to indicate the displacement sensing apparatus has been displaced. I.e. when the amount of measured displacement is considered to satisfy a detection trigger criterion. In principle, a straightforward way of doing this is to define a simple threshold level for the output of the displacement sensor and to consider there to be a displacement of the displacement element if the output from the displacement sensor capacitance measurement circuitry crosses the threshold level. However, in practice the sensitivity of capacitance measurements to external influences and manufacturing tolerances means that rather than simply compare the instantaneous output from the capacitance measurement circuitry with a fixed threshold, it is generally better to compare the difference between the output from the capacitance measurement circuitry and a baseline/background value with a threshold, where the baseline/background value is intended to reflect the currently expected output from the capacitance measurement circuitry when there is no displacement. Certain embodiments of the disclosure relate to approaches for establishing a suitable background/base line value.

Figure 4A:
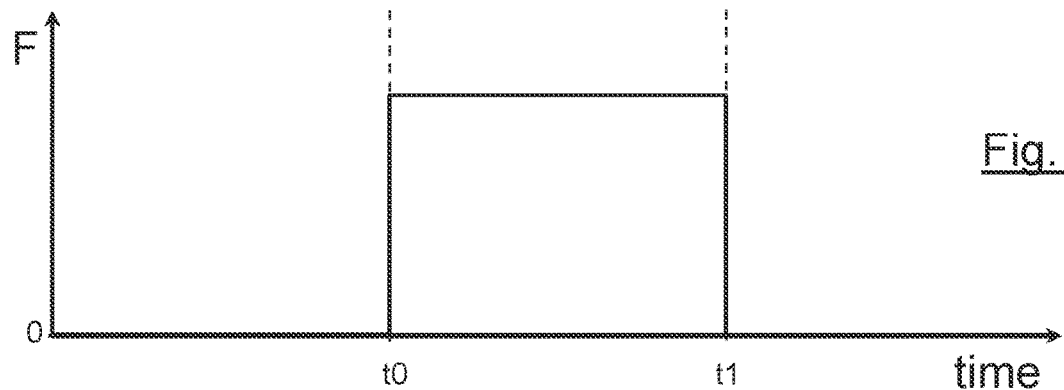
FIGS. 4A to 4C are graphs schematically representing some aspects of a known approach to detecting when a displacement occurs.
Figure 4B:
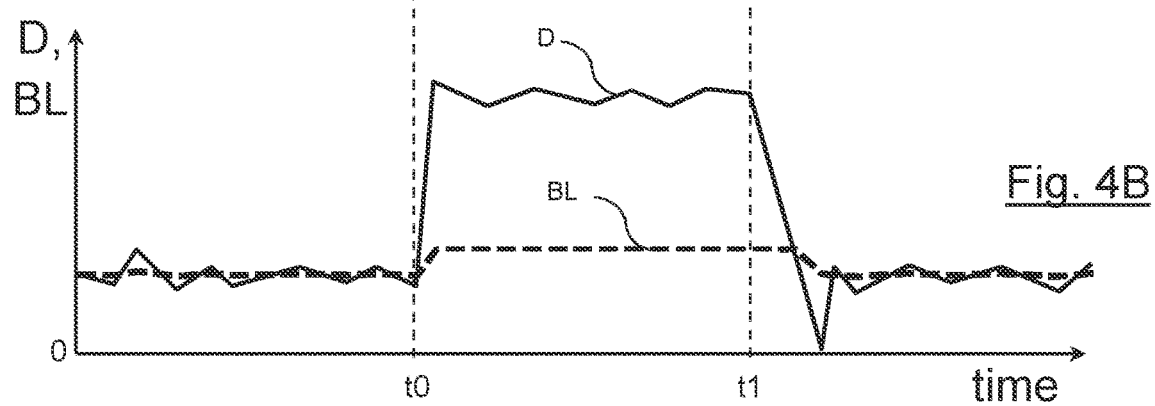
Figure 4C:
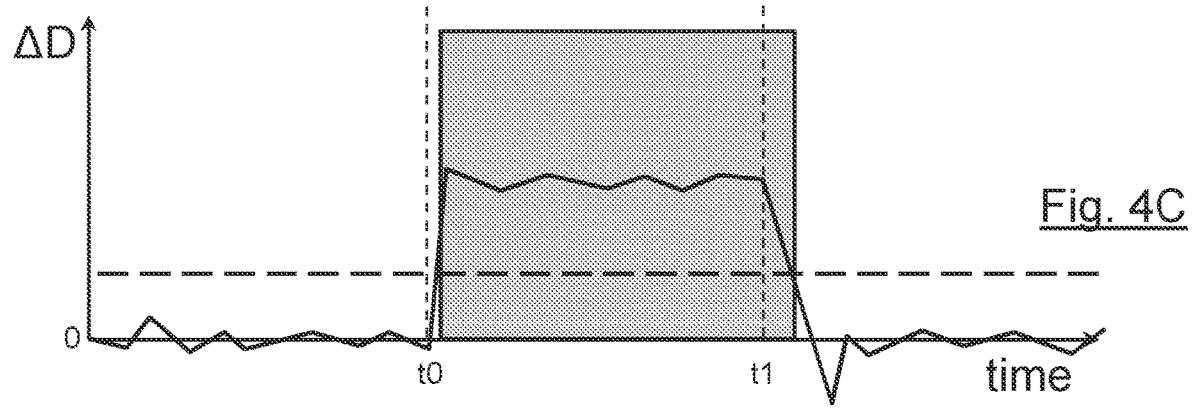

FIGS. 4A to 4C are graphs schematically showing a known way for determining when the output from a displacement sensor should be considered to indicate there is a displacement of a displacement element (i.e. determining when a measured displacement meets a trigger criterion/threshold for indicating a displacement is considered to have occurred). In this example it is assumed a user presses their finger on a displacement element of a displacement sensor to apply a displacement load/force at time t0 and removes their finger (and hence the load/force) at time t1. It is assumed here the displacement sensor is structurally similar to the displacement sensor represented in FIGS. 1 to 3, but differs from displacement sensors in accordance with certain embodiments of the disclosure discussed herein in how the output from the displacement sensor is processed to determine when a displacement occurs (i.e. when the trigger criterion is met).

FIG. 4A is a graph schematically showing the force, F, (in arbitrary units) applied by the user's finger as a function of time during the press. Before the user presses on the displacement element at time t0 there is no force applied by the displacement element, between times t0 and t1 the user applies a steady force, and after the user removes their finger at time t1 there is again no force applied by the user. It will be appreciated FIG. 4A represents a somewhat idealised force profile and in practice the force applied by the user may be expected to vary slightly during the touch and to ramp up and ramp down less suddenly than shown in FIG. 4A. However, this is not significant to the principles described herein.

FIG. 4B is a graph schematically showing the displacement sensor output signal, D, (in arbitrary units) and a baseline displacement sensor output signal, BL, (in the same arbitrary units) for the displacement sensor output signal determined according to conventional techniques as a function of time during the press on the displacement element represented by the force profile of FIG. 4A.

FIG. 4C is a graph schematically showing the difference, ΔD, between the displacement sensor output signal, D, and the baseline displacement sensor output signal, BL, shown in FIG. 4B (in the same arbitrary units). Also shown in FIG. 4C by a dashed horizontal line is a detection threshold value. This indicates the amount of measured displacement which is to be taken to correspond with a determination that a displacement is to be considered to have occurred. The level of the threshold may be set according to the application at hand, for example having regard to how the displacement sensor output signal changes with displacement and a desired level of displacement required to correspond with a determination there has been a displacement. In general an appropriate threshold level may, for example, be determined through empirical testing.

The displacement element of the displacement sensor associated with the graphs represented in FIGS. 4A to 4C is considered to be in a displaced state when the difference, ΔD, between the displacement sensor output signal D and the baseline displacement sensor output signal BL exceeds the detection threshold value. For the example force profile represented in FIG. 4A, the period of time during which the difference, ΔD, between the displacement sensor output signal, D, and the baseline displacement sensor output signal, BL, exceeds the detection threshold value is schematically represented in FIG. 4C by a shaded block. That is to say, the shaded area in FIG. 4C represents the period of time during which the sensing apparatus 1 reports there is a displacement in response to the force profile represented in FIG. 4A. The sensing apparatus may simply report an indication that a displacement is deemed to be present (i.e. a binary indication) or an indication of the magnitude of the measured displacement (e.g., based on the value of ΔD), depending on the implementations at hand.

In accordance with conventional techniques, the baseline, BL, represented in FIG. 4B may be determined by low-pass filtering (or otherwise smoothing/box car averaging) the displacement sensor output until it is initially determined the difference, ΔD, exceeds a threshold value (this threshold value may be referred to as a tracking threshold, and may, for example, be the same as the detection threshold or may be less than the detection threshold value). When it is initially determined the difference, ΔD, exceeds the tracking threshold, the baseline value, BL, is frozen for so long as the difference, ΔD, remains above the threshold value. When the difference, ΔD, falls below the threshold value at the end of the users press (i.e., around the time t1), baseline value is again determined by low-pass filtering the displacement sensor output.

The inventors have recognised there can be some issues with approaches along the lines discussed above with reference to FIGS. 4A to 4C. For example, a displacement sensor will typically include a degree of resilience to soften a user's press on the displacement element, both to provide a more tactile experience for the user and to help avoid damaging the sensing apparatus when subject to sudden heavy loads. In the example displacement sensor discussed above with reference to FIGS. 1 to 3, resilience is provided by a combination of the deformable electrode 5 and the resilient support element 8. However, the displacement resilience for the displacement element can delay how quickly the displacement element returns to its rest position when a displacement force is removed. This can cause the displacement sensor to continue to report there is displacement of the displacement element after the user has stopped pressing on the displacement element, leading to what may be perceived by the user as a sluggish response. This is apparent in FIGS. 4A to 4C in the relatively slow decay in reported displacement, D, after the load, F, is removed at time t1. A consequence of this is that the difference, ΔD, between the displacement sensor output signal, D, and the baseline displacement sensor output signal, BL, remains above the threshold for detection for a period after the displacement load is removed while the displacement element settles back to its rest (non-displaced) position. This results in the period in which the displacement element is deemed to be in a displaced state extending beyond the time t1 when the load is removed (as can be seen by the extent of the shaded area in FIG. 4C), resulting in what users may perceive as sluggish behaviour as noted above.

To help address some of the issues resulting from approaches of the kind represented in FIGS. 4A to 4C, new approaches for processing output signals from a sensing apparatus comprising both a displacement sensor and a touch sensor are proposed.

In broad summary, certain embodiments of the disclosure differ from existing approaches in how a baseline displacement sensor output signal is determined for comparison with the displacement sensor output signal to determine when there is considered to be a displacement (i.e. when the difference between the displacement sensor output signal and the baseline meets a trigger criterion, e.g. exceeds a predefined threshold value). In particular, in a sensing apparatus having both a displacement sensor and a touch sensor, for example as discussed above with reference to FIGS. 1 to 3, the sensing apparatus may be configured to make use of the output from the touch sensor to establish an appropriate baseline displacement sensor output signal value. For example, in accordance with certain embodiments, when the touch sensor reports there are no objects touching the displacement element, the baseline displacement sensor output signal may be set to the value of the displacement sensor output signal itself (i.e. so the difference between them is forced to 0), but when the touch sensor reports there is an object touching the displacement element of the displacement sensor, the baseline displacement sensor output signal may instead be fixed (frozen) for the duration of the detected touch to a value of the displacement sensor output signal from around when the touch is initially detected (i.e. based on a value for the displacement sensor output signal in a time period determined according to when the touch is initially detected). For example, the baseline displacement sensor output signal may be set to the value of the displacement sensor output at the same time, or just before, a touch is initially detected, or alternatively, the baseline displacement sensor output signal may be set to an average of the values of the displacement sensor output in a time window ending when the touch is first detected.

When the touch sensor reports the object is removed from the display element (i.e. no longer touching the display element), the baseline displacement sensor output signal may again track the value of the displacement sensor output signal itself. Thus, in accordance with this approach, the sensing apparatus is in effect configured to only allow a displacement to be detected when the touch sensor reports there is an object touching the displacement element.

Accordingly, in accordance with certain embodiments a sensing apparatus may comprise a displacement sensor comprising capacitance measurement circuitry configured to provide a displacement sensor output signal indicative of a separation between a frame element and a displacement element movably mounted with respect to the frame element and a touch sensor comprising measurement circuitry, e.g. capacitance measurement circuitry, configured to provide a touch sensor output signal indicative of when an object is determined to be touching the displacement element. A signal processing element for the sensing apparatus may be configured to output a detection signal to indicate there is determined to be a displacement of the displacement element relative to the frame element in response to determining an object is touching the displacement element and a difference between the displacement sensor output signal and a baseline displacement sensor output signal exceeds a threshold value, wherein the baseline displacement sensor output signal is determined from the displacement sensor output signal during a time period around when the object is initially determined to be touching the displacement element.

FIGS. 5A to 5D are graphs schematically showing an approach for determining when the output from the displacement sensor of the sensing apparatus 1 represented in FIGS. 1 to 3 should be considered to indicate there is a displacement of the displacement element in accordance with certain embodiments of the disclosure. As for FIGS. 4A to 4C, it is assumed here that a user presses their finger on displacement element 3 of the displacement sensor to apply a displacement load/force at time t0 and removes their finger (and hence the load/force) at time t1.

Figure 5A:
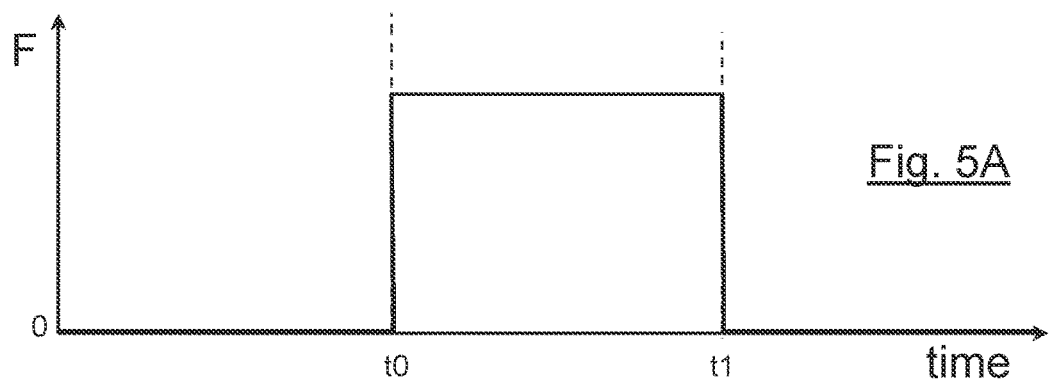
FIGS. 5A to 5D are graphs schematically representing some aspects of an approach to detecting when a displacement occurs using the sensing apparatus of FIGS. 1 to 3 in accordance with certain embodiments of the disclosure.

FIG. 5A is a graph schematically showing the force, F, (in arbitrary units) applied by the user's finger as a function of time during the press. Before the user presses on the displacement element at time t0 there is no force applied by the displacement element, between times t0 and t1 the user applies a steady force, and after the user removes their finger at time t1 there is again no force applied by the user. As with FIG. 4A, it will be appreciated FIG. 5A represents a somewhat idealised force profile and in practice the force applied by the user may be expected to vary slightly during the touch and to ramp up and ramp down less suddenly than shown in FIG. 5A. However, this is not significant to the principles described herein.

Figure 5B:
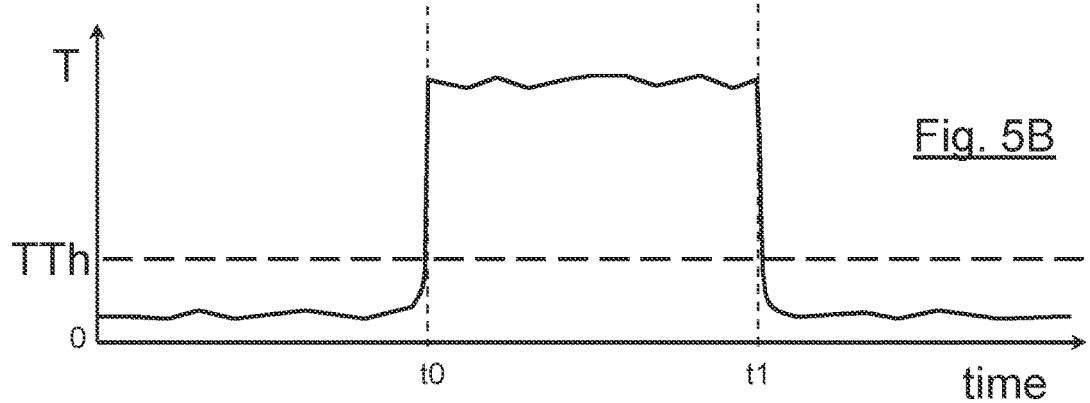

FIG. 5B is a graph schematically showing the touch sensor output signal, T, (in arbitrary units) as a function of time during the press on the displacement element represented by the force profile of FIG. 5A. The output from the touch sensor can be seen to initially begin to increase from its typical background (quiescent) value as a user's finger approaches the touch sensor before starting to apply pressing force a time t0. As is well established, a touch sensor will typically be sensitive to an object in proximity to the touch sensor's sensing surface even if the object is not physically contacting sensing surface, and in that regard it will be appreciated a determination that an object is touching a sensing surface may in fact be made before the object actually physically contacts the touch sensor, depending on the touch sensor detection threshold. When the user's finger contacts the touch sensor and begins applying force at time t0, the touch sensor output rapidly increases and remains steady (except for noise and any variations from movement of the user's finger) for the duration of the touch (i.e. between times t0 and t1 while the pressing force is being applied). When the user releases their finger at time t0 the output from the touch sensor falls back to its background level. As is well established for touch sensors, a touch detection threshold, TTh, may be defined (as indicated by the dashed line in FIG. 5B) which corresponds to the level of touch sensor output considered to correspond to detection of an object touching the touch sensitive surface of the touch sensor.

Thus, with reference to FIG. 5B, it can be seen the rapid rise in touch sensor output once the user's finger contacts the touch sensor at time t0 means the touch sensor output signal starts to exceed the threshold value TTh at a time which is very close to t0. Similarly, the rapid fall in touch sensor output once the user's finger loses contact with the touch sensor at time t1 means the touch sensor output signal falls below the threshold value TTh at a time which is very close to t1. Consequently, it will be appreciated the touch sensor output allows for relatively precise determining of when a user's finger is considered to be touching displacement element 3. Although not discussed herein for simplicity, it will be appreciated in some cases the comparison of the touch sensor output with a threshold to determine when a touch has occurred may be based on comparing a difference between the touch sensor output and a touch sensor baseline with the threshold value in a manner corresponding to that discussed above with reference to the displacement sensor output represented in FIG. 4B. For example, a baseline value for the touch sensor output may also be determined by filtering/smoothing the touch sensor output. Because the touch sensor response is more rapid than the displacement sensor response, the issues discussed above with this approach for the displacement sensor are less concerning for the touch sensor.

Figure 5C:
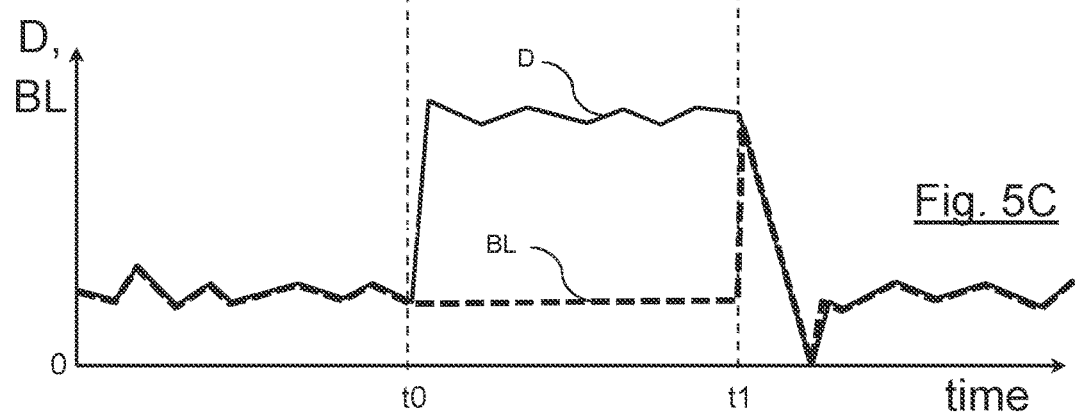

FIG. 5C is a graph schematically showing the displacement sensor output signal, D, (in arbitrary units) and a baseline displacement sensor output signal, BL, (in the same arbitrary units) for the displacement sensor output signal determined in accordance with an embodiment of the disclosure as a function of time during the press on the displacement element represented by the force profile of FIG. 5A.

Figure 5D:
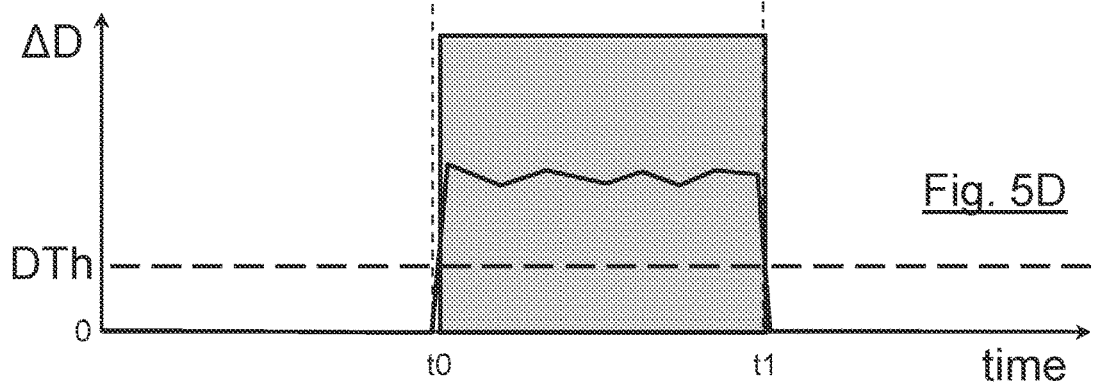

FIG. 5D is a graph schematically showing the difference, $\Delta D$, between the displacement sensor output signal, D, and the baseline displacement sensor output signal, BL, shown in FIG. 5C (in the same arbitrary units). Also shown in FIG. 5D by a dashed horizontal line is a displacement threshold value DTh. This indicates the amount of measured displacement which is to be taken to correspond with a determination that a displacement is to be considered to have occurred. The level of the threshold may be set according to the application at hand, for example having regard to how the displacement sensor output signal changes with displacement and a desired level of displacement required to correspond with a determination there has been a displacement. In general an appropriate threshold level may, for example, be determined through empirical testing.

Thus, the displacement element of the displacement sensor associated with the graphs represented in FIGS. 5A to 5D is considered to be in a displaced state when the difference, $\Delta D$, between the displacement sensor output signal D and the baseline displacement sensor output signal BL exceeds the detection threshold value DTh. For the example force profile represented in FIG. 5A, the period of time during which the difference, $\Delta D$, between the displacement sensor output signal, D, and the baseline displacement sensor output signal, BL, exceeds the detection threshold value is schematically represented in FIG. 5D by a shaded block.

That is to say, the shaded area in FIG. 5D represents the period of time during which the sensing apparatus 1 reports there is a displacement in response to the force profile represented in FIG. 5A in accordance with certain embodiments of the disclosure. The sensing apparatus may simply report an indication that a displacement is deemed to be present (i.e. a binary indication) or an indication of the magnitude of the measured displacement itself (e.g., based on the value of $\Delta D$), depending on the implementations at hand. In this regard it will be appreciated what is of primary significance in accordance with certain embodiments of the disclosure is how the sensing apparatus determines when a displacement is deemed to have occurred, and not what is actually reported when in the determined a displacement is deemed to have occurred.

In accordance with embodiments of the disclosure, and as discussed above, the baseline, BL, represented in FIG. 5C is determined by setting the baseline value to the displacement sensor output signal whenever the touch sensor reports there is no object touching the displacement element. This may be based on the comparison of the touch sensor output with a touch sensor detection threshold TTh as discussed above with reference to FIG. 5B. This means the difference $\Delta D$ between the displacement sensor output signal and the displacement sensor baseline value represented in FIG. 5D is forced to 0 before and after the touch is detected. However, when a touch is detected, in accordance with certain embodiments of the disclosure the baseline value becomes fixed (frozen) at its level immediately before the touch is first detected and maintains this value for as long as the touch sensor output indicates there is still considered to be a touch (i.e. for as long as the touch sensor output remains above the touch sensor detection threshold TTh as indicated in FIG. 5B). That is to say the displacement sensor baseline value is set to the most recent displacement sensor output signal value seen before the touch is detected by the touch sensor at time t0 and remains at this value until time t1. At time t1 the touch sensor reports the object is no longer touching the displacement element 3 (i.e. the magnitude of the capacitive coupling between the object and the touch sensor falls below the detection threshold TTh). In response the processing circuitry 4C reverts to setting the displacement sensor baseline to the displacement sensor output signal (i.e. the baseline reverts to tracking the displacement sensor output signal). Consequently, this in effect forces the difference between the displacement sensor output signal and the displacement sensor baseline to 0, which of course is below the displacement detection threshold DTh, thereby resulting in a determination the displacement has stopped. Thus, it will be appreciated this approach in which the displacement sensor output is in effect qualified by the touch sensor output allows the sensing apparatus to more precisely indicate when the displacement sensor is considered to be displaced than with existing techniques. This is apparent in FIGS. 5A to 5D in the relatively fast decay in the difference, $\Delta D$, between the displacement sensor output signal, D, and the baseline displacement sensor output signal, BL, despite the relatively slow decay in the reported displacement, D, after the load, F, is removed at time t1. A consequence of this is that the difference, $\Delta D$, between the displacement sensor output signal, D, and the baseline displacement sensor output signal, BL, remains above the threshold for detection for a period that more closely matches the period during which the force is applied as compared with the approach represented in FIGS. 4A to 4C. This is apparent in FIG. 5D with the shaded area more closely representing the period of time between t0 and t1.

It will be appreciated that while the above-described approaches have included examples of how to process the end of a touch, in some implementations it may not be required to detect when a touch is finished. For example, the sensing apparatus may be incorporated in a device in which detection of a displacement switches off the apparatus (i.e. the displacement sensor is in provides an "off" button). In this case there may be no need to provide any means for detecting the end of the touch since the device may switch off as soon as touch is initially detected.

Figure 6:
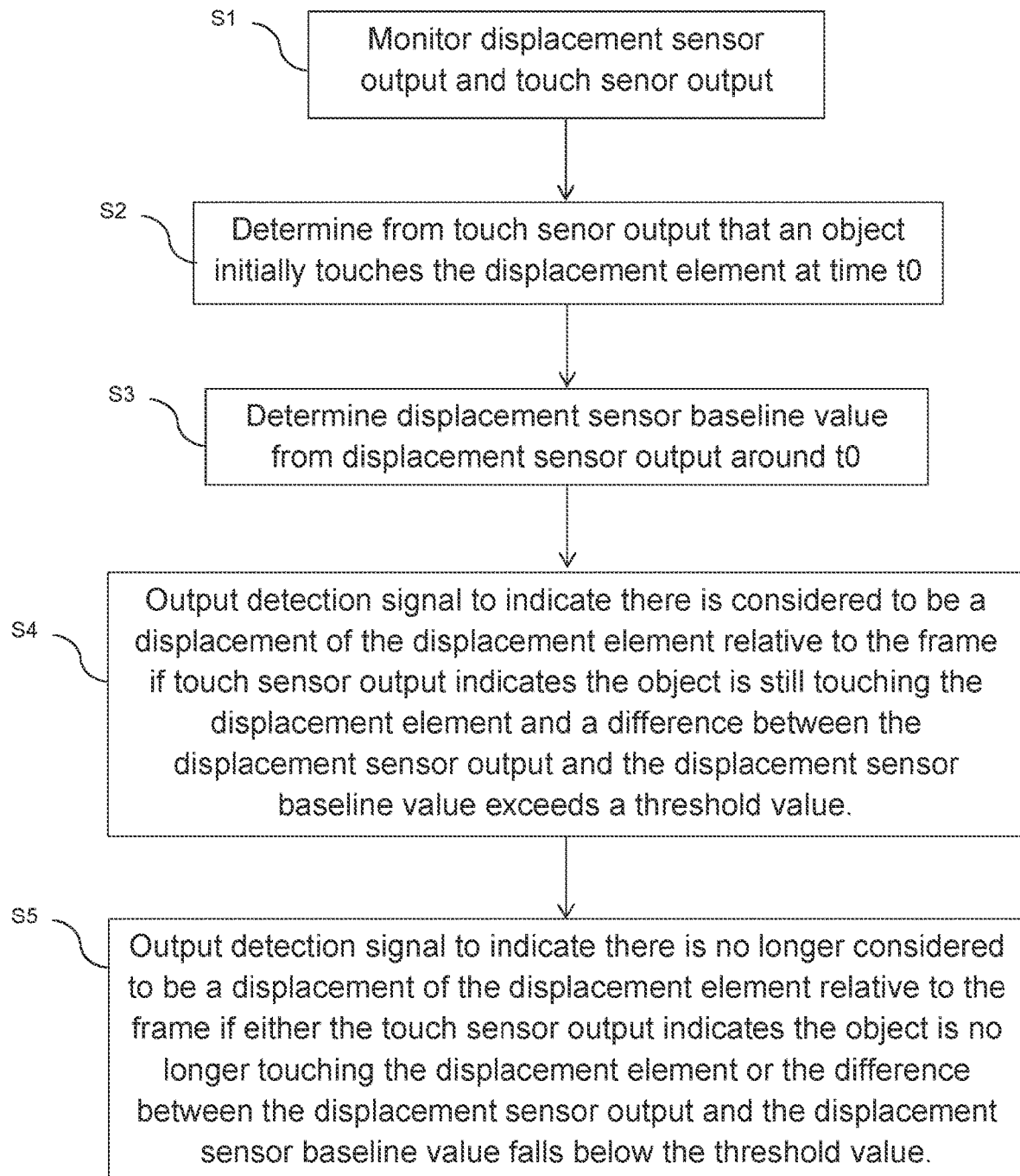
FIG. 6 is a flow chart schematically representing steps in an approach to detecting when a displacement occurs using the sensing apparatus of FIGS. 1 to 3 in accordance with certain embodiments of the disclosure.

FIG. 6 is a flow diagram representing some of the steps performed by the processing circuitry 4C of the control unit 4 for the sensing apparatus 1 to implement the approach discussed above with reference to FIGS. 5A to 5D.

As schematically indicated in step S1, the processing circuitry 4C monitors the outputs from the displacement sensor (received from the displacement sensor measurement circuitry 4A) and the touch sensor (received from the touch sensor measurement circuitry 4B) throughout the process.

In step S2 the processing circuitry 4C determines from the touch sensor output signal that an object initially touches the displacement element at time t0 in accordance with the principles discussed above, e.g., with reference to FIG. 5B.

In step S3 the processing circuitry determines a displacement sensor baseline value to use while the object is determined to be touching the displacement element. This is determined from the displacement sensor output signal around time t0. As discussed elsewhere herein, the baseline value may, for example, be frozen at the latest value reported by the displacement sensor (i.e. the displacement sensor output signal value) prior to the touch sensor indicating an object is touching the displacement element.

In step S4 the processing circuitry determines whether or not a difference between the displacement sensor output signal value and the displacement sensor baseline value determined in step S3 exceeds a predefined threshold value while the touch sensor continues to report the object is still touching the displacement element, and if so, outputs a signal to indicate there is considered to be a displacement of the displacement element relative to the frame. This output signal may then be used by a host apparatus (e.g. a mobile telephone) in which the sensing apparatus is incorporated to respond accordingly depending on the corresponding functionality of the apparatus in which the sensing apparatus included.

It will be appreciated the manner in which the host apparatus is configured to react to a determination that a displacement is detected (e.g. a user has pressed the displacement element) is not significant to the principles described herein.

In step S5 the processing circuitry is configured to output a detection signal which indicates there is no longer considered to be a displacement of the displacement element if either (i) the touch sensor output indicates the object is no longer touching the displacement element (i.e. touch sensor output falls below touch sensor and threshold TTh), or (ii) if the difference between the displacement sensor output signal value and the displacement sensor baseline value determined in step S3 falls below the predefined threshold value. Providing the second mechanism for detecting the end of a press (i.e. when the difference between the displacement sensor output signal value and the displacement sensor baseline falls below the predefined threshold value) allows the processing circuitry to determine the displacement element is no longer displaced when a user releases pressure, but maintains contact.

It will be appreciated there are various modifications that can be applied to the above-described approaches.

For example, in the above described approaches it is assumed the baseline is configured to track the displacement sensor output signal when there is no touch detected, and so the difference between them is forced to zero such that the difference cannot exceed the displacement sensor detection threshold DTh unless a touch is detected. However, it can will be appreciated the same results can be achieved with different specific implementations. For example, whereas in some implementations the processing circuitry 4C may be configured to continually determine whether the difference between the displacement sensor output signal value and baseline displacement sensor output signal value exceeds the pre-determined threshold to indicate a displacement has occurred on an ongoing basis, in other implementations the processing circuitry may be configured to in effect bother performing this comparison when there is no touch detected since in these conditions the difference is forced to 0 and cannot exceed the threshold value.

Furthermore, it will be appreciated that while in the above examples it has been assumed the various output signals are configured to increase in response to the presence of an object (in the case of the touch sensor output) and in response to increasing displacement (in the case of the displacement sensor output), depending on the specific measurement circuitry configuration it is possible the output signals in another example will decrease on detection of a touch and/or increasing displacement. In this regard it will be appreciated that what is significant is that the magnitude of the respective signals/differences between the respective signals and the respective baseline values is what is significant, and not specifically whether the signals increase or decrease in response to detecting an object/increasing displacement.

It will further be appreciated that while the above example embodiments have focused on a touch sensor using capacitive sensing techniques, the same principles can be applied in respect of other technologies for detecting touch, for example resistance-based sensing technologies. Indeed, in some implementations the touch sensor could in principle even comprise a mechanical switch mounted to the displacement element. What is significant in accordance with certain embodiments of the disclosure is not the specific technology underlying the touch sensor, but rather that the touch sensor is able to provide a signal indicating when an object is considered to be touching (directly or indirectly) the displacement element.

Thus there has been described sensing apparatus comprising: a displacement sensor comprising capacitance measurement circuitry configured to provide a displacement sensor output signal indicative of a separation between a frame element and a displacement element movably mounted with respect to the frame element; a touch sensor comprising measurement circuitry configured to provide a touch sensor output signal indicative of when an object is determined to be touching the displacement element; and a processing element configured to output a displacement detection signal to indicate there is determined to be a displacement of the displacement element relative to the frame element in response to determining the touch sensor output signal indicates an object is touching the displacement element and a difference between the displacement sensor output signal and a baseline displacement sensor output signal exceeds a threshold value, wherein the baseline displacement sensor output signal is determined from the displacement sensor output signal in a time period determined from when the touch sensor output signal initially indicates the object is touching the displacement element.

The systems described above make use of both displacement data and amplitude data corresponding to each object detected on a sensing surface to determine which of the objects applies an additional load. Generally, a change in displacement data is used as a trigger to search the corresponding amplitude data for changes therein within a defined time window.

Further particular and preferred aspects of the present invention are set out in the accompanying independent and dependent claims. It will be appreciated that features of the dependent claims may be combined with features of the independent claims in combinations other than those explicitly set out in the claims.

REFERENCES

[1] Capacitive Sensors: Design and Applications by Larry K. Baxter, August 1996, Wiley-IEEE Press, ISBN: 978-0-7803-5351-0

The invention claimed is:

1. A sensing apparatus comprising:
a displacement sensor comprising capacitance measurement circuitry configured to provide a displacement sensor output signal indicative of a separation between a frame element and a displacement element movably mounted with respect to the frame element;
a touch sensor comprising measurement circuitry configured to provide a touch sensor output signal indicative of when an object is determined to be touching the displacement element; and
a processor configured to output a detection signal to indicate there is determined to be a displacement of the displacement element relative to the frame element in response to determining the touch sensor output signal indicates an object is touching the displacement element and a difference between the displacement sensor output signal and a baseline displacement sensor output signal exceeds a threshold value, wherein when the touch sensor outputs a touch sensor output signal indicative of when an object is determined to be touching the displacement element, the processor is configured to determine the baseline displacement sensor output signal for a duration of the detected touch of the object from the displacement sensor output signal during a time period defined by when the touch sensor output signal initially indicates the object is touching the displacement element, such that the baseline displacement sensor output signal maintains a fixed value for the duration of the detected touch of the object, wherein the baseline displacement sensor output signal is set to the displacement sensor output signal when no touch of an object is sensed by the touch sensor.

2. The sensing apparatus of claim 1, wherein the time period ends when the touch sensor output signal initially indicates the object is touching the displacement element.

3. The sensing apparatus of claim 1, wherein the baseline displacement sensor output signal is set to the current value for the displacement sensor output signal when the touch sensor output signal initially indicates the object is touching the displacement element.

4. The sensing apparatus of claim 1, wherein the baseline displacement sensor output signal is set to an average of values for the displacement sensor output signal during the time period.

5. The sensing apparatus of claim 1, wherein the processor is further configured to output a detection signal to indicate there is no longer determined to be a displacement of the displacement element relative to the frame element in response to determining the touch sensor output signal indicates there is no longer an object touching the displacement element.

6. The sensing apparatus of claim 1, wherein the processor is further configured to output a detection signal to indicate there is no longer determined to be a displacement of the displacement element relative to the frame element in response to determining the difference between the displacement sensor output signal and the baseline displacement sensor output no longer exceeds the threshold value.

7. The sensing apparatus of claim 1, wherein displacement sensor comprises a reference electrode and a deformable electrode arranged between the displacement element and the frame element, wherein the deformable electrode has a contact surface facing the reference electrode and insulated therefrom by an insulator layer, and wherein at least part of the contact surface is inclined relative to an opposing surface of the reference electrode such that when the deformable electrode is compressed by a displacement of the displacement element towards the frame element there is a reduction in volume between the contact surface and the opposing surface of the reference electrode, and wherein the output signal from the capacitance measurement circuitry for the displacement sensor comprises an indication of a capacitive coupling between the deformable electrode and the reference electrode measured by the capacitance measurement circuitry for the displacement sensor.

8. The sensing apparatus of claim 7, wherein the deformable electrode is sized so as to be in compression between the displacement element and the frame element when the displacement element is in its rest position with no displacement load applied.

9. The sensing apparatus of claim 7, wherein the deformable electrode is formed from an elastomeric conductive foam.

10. The sensing apparatus of claim 1, wherein the measurement circuitry for the touch sensor comprises capacitance measurement circuitry configured to measure a capacitive coupling associated with one or more touch sensor electrodes on the displacement element.

11. The sensing apparatus of claim 1, wherein the measurement circuitry for the touch sensor is configured to provide the touch sensor output signal indicative of when an object is determined to be touching the displacement element in response to determining a difference between a measured capacitive coupling associated with the one or more touch sensor electrodes and a baseline for the capacitive coupling associated with the one or more touch sensor electrodes exceeds a predetermined touch detection threshold.

12. An apparatus comprising the sensing apparatus of claim 1.

13. A method comprising:
using a displacement sensor comprising capacitance measurement circuitry to obtain a displacement sensor output signal indicative of a separation between a frame element and a displacement element movably mounted with respect to the frame element;
using a touch sensor comprising measurement circuitry to obtain a touch sensor output signal indicative of when an object is determined to be touching the displacement element; and outputting a detection signal to indicate there is determined to be a displacement of the displacement element relative to the frame element in response to determining the touch sensor output signal indicates an object is touching the displacement element and a difference between the displacement sensor output signal and a baseline displacement sensor output signal exceeds a threshold value, wherein when the touch sensor outputs a touch sensor output signal indicative of when an object is determined to be touching the displacement element, the baseline displacement sensor output signal for a duration of the detected touch of the object is determined from the displacement sensor output signal during a time period defined by when the touch sensor output signal initially indicates the object is touching the displacement element, such that the baseline displacement sensor output signal maintains a fixed value for the duration of the detected touch of the object, wherein the baseline displacement sensor output signal is set to the displacement sensor output signal when no touch of an object is sensed by the touch sensor.

* * * * *